Figure 1:
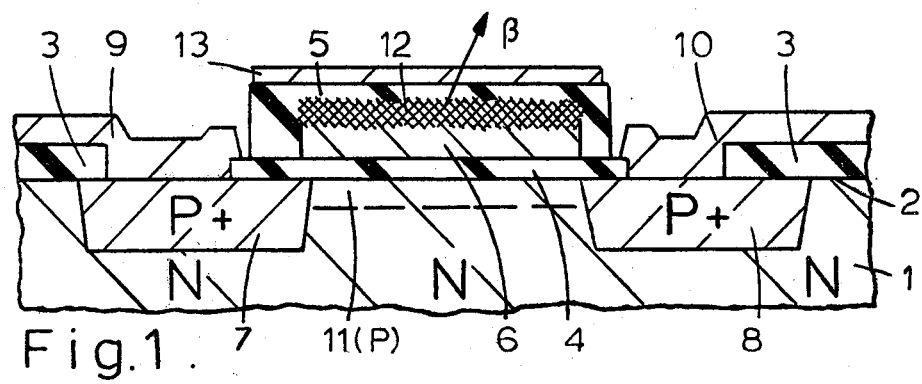

United States Patent [19]  [11]  4,275,405
Shannon  [45]  Jun. 23, 1981

[54] SEMICONDUCTOR TIMING DEVICE WITH RADIOACTIVE MATERIAL AT THE FLOATING GATE ELECTRODE OF AN INSULATED-GATE FIELD-EFFECT TRANSISTOR

[75] Inventor: John M. Shannon, Salfords, near Redhill, England

[73] Assignee: Mullard Limited, London, England

[21] Appl. No.: 742,211

[22] Filed: Nov. 16, 1976

Related U.S. Application Data

[63] Continuation of Ser. No. 633,118, Nov. 18, 1975, abandoned, which is a continuation of Ser. No. 433,802, Jan. 16, 1974, abandoned.

[30] Foreign Application Priority Data

Oct. 11, 1973 [GB] United Kingdom ................. 3173/73

[51] Int. Cl.³ ............... H01L 29/78; H01L 29/34; G01T 1/24; G04C 3/00
[52] U.S. Cl. ............................ 357/23; 357/29; 357/54; 357/91; 368/203
[58] Field of Search ................ 357/23, 29, 91, 54; 58/23 C, 23 AC, 23 R

[56] References Cited

U.S. PATENT DOCUMENTS

| 3,370,414 | 2/1968 | Lazrus et al. | 58/23 R |
| 3,562,613 | 2/1971 | Adler et al. | 58/23 R |
| 3,582,656 | 6/1971 | Koehler | 357/29 |
| 3,629,582 | 12/1971 | Koehler et al. | 58/23 R |
| 3,653,978 | 4/1972 | Robinson et al. | 357/91 |
| 3,825,946 | 7/1974 | Frohman-Bentchkowsky | 357/23 |
| 3,872,493 | 3/1975 | Roberts et al. | 357/29 |

OTHER PUBLICATIONS

Frohman-Bentchkowsky "ROM Can Be Electrically Programmed . . .", Electronics (5/10/71) pp. 91-95.
Price, *Nuclear Radiation Detection* McGraw-Hill, New York, 2nd Ed., 1964, pp. 1-3, 14-21.
Bhatia et al., "Irradiation Technique for Making Single Electrode Charge Coupled Storage Cell", IBM Tech. Disclosure Bulletin, vol. 15 (8/72) pp. 723-724.
Everhart et al., "Determination of Kilovolt Energy Dissipation vs. Penetration Distance in Solid Materials", Journal of Applied Physics, vol. 42 (12/71) pp. 5837-5846.
Greeneich et al., "An Approximate Formula for Electron Energy Versus Path Length", IEEE Trans. Electron Devices (6/73) pp. 598-600.

*Primary Examiner*—Gene M. Munson
*Attorney, Agent, or Firm*—Thomas A. Briody; Robert T. Mayer; Jack E. Haken

[57] ABSTRACT

A semiconductor timing device having a charge storage region, the charge state of which may be detected by field effect action, the charge storage region containing radioactive material which decays by emitting charged nuclear particles, so that the charge state of the charge storage region varies progressively with time.

11 Claims, 4 Drawing Figures

SEMICONDUCTOR TIMING DEVICE WITH RADIOACTIVE MATERIAL AT THE FLOATING GATE ELECTRODE OF AN INSULATED-GATE FIELD-EFFECT TRANSISTOR

This is a continuation of application Ser. No. 633,118, filed Nov. 18, 1975, now abandoned, which was a continuation of application Ser. No. 433,802, filed Jan. 16, 1974, now abandoned.

This invention relates to semiconductor devices, particularly but not exclusively insulated gate field-effect devices for use as timing devices.

Nowadays, numerous systems incorporate a timer. Washing machines and cookers require timers operating over seconds or hours without the need for very great accuracy. Electronic watches however require time keeping to be accurate to about 1 part in $10^4$. Bank vaults, strong-rooms and other chambers could use timers operating over days, months or even years.

According to the present invention there is provided a semiconductor device suitable for use as a timer in which radioactive decay is employed to control an operating condition of the device with time.

One advantage of a device in accordance with the invention is that since radioactive material decays without an external power source, no external power is dissipated when such a device is counting time.

Such devices can be made for a variety of timing operations, by appropriately choosing the quantity of radioactive material present and its half-life. Thus, by providing a large quantity of an element having a short half-life, the operating conditions of the device can be made to change rapidly so providing a short-interval timer. However, if it is desired to use the device to time a plurality of intervals throughout the life of the device, it is generally desirable for the device operating conditions to change at a substantially constant rate throughout the life of the device. This can be achieved by selecting a radioactive isotope having a long half-life compared with the life of the device, so that the radioactive decay which occurs during the life of the device produces a negligible change in the level of radio activity during that life. Thus, for a device having a life of the order of 10 years, the half-life chosen will generally be at least of the order of $10^2$ years.

One form of semiconductor device in accordance with the invention may comprise a semiconductor body portion, a charge-storage region on the semiconductor body portion and spaced therefrom by insulating material so that, by field effect action across the insulating material, the charge state of the charge-storage region influences the surface potential of the semiconductor body portion under the charge-storage region, and in the vicinity of which charge-storage region a radioactive element is present the radioactive decay of which changes the charge state of the charge-storage region to control with time the said surface potential. The radioactive decay may increase or decay the said surface potential, and be used in a variety of semiconductor devices.

One specific form of semiconductor device in accordance with the invention is an insulated-gate field-effect device comprising a semiconductor body portion, a gate region on the semiconductor body portion and spaced therefrom by insulating material so that, by field-effect action across the insulating material, the charge state and potential of the gate region influences a channel in which charge carriers can be made to flow in the semiconductor body portion under the gate region, in the vicinity of which gate region there is present a radioactive element, the radioactive decay of which changes the charge state and potential of the gate region to control with time the conductance in the channel. The channel conductance may be increased or decreased by the radioactive decay, so that the device may operate in the enhancement-mode or in the depletion-mode. A measure of time elapsed can then be obtained from the change in current through the channel. The radioactive decay may be employed to take the potential of the gate region through a threshold value to either form or pinch-off the channel of the device so switching the device either on or off. In one preferred form the gate region is wholly surrounded by insulating material and has no supply conductor connection.

Preferably, the radioactive decay emits electrically-charged particles for instance beta ($\beta$)particles. In a preferred form, the radioactive element decays directly into a stable product or into a product having a much longer half-life so simplifying the reactions influencing the charged state during the life of the device.

The semiconductor device may be for example a transistor and may be an element of an integrated circuit.

Embodiments of the present invention will now be described, by way of example, with reference to the diagrammatic drawings accompanying the Provisional Specification, of which:

FIGS. 1 to 4 are cross-sectional views of four different insulated-gate field-effect transistors (hereinafter termed IGFET's) in accordance with the present invention.

The IGFET shown in FIG. 1 is a p-channel depletion mode device. The device comprises part of a semiconductor substrate 1 of n-type conductivity having a major surface 2. An insulating layer structure 3, 4 and 5 is present at the surface 2. A gate region in the form of an electrode layer 6 is present on the thin insulating layer portion 4 and is separated thereby from the surface 2. The gate electrode 6 is sandwiched between and wholly surrounded on all sides by the insulating layer portions 4 and 5. There is no supply conductor connection to the gate electrode 6 which thus has a floating potential depending on its charge state. The gate electrode 6 is a charge-storage region of the device.

The gate electrode 6 overlies a p-type channel 11 at part of the surface 2 between source (7, 9) and drain (8, 10) of the IGFET. The source and drain may include separate p-type source and drain regions 7 and 8 respectively which are present in the n-type substrate 1 adjacent the surface 2, and which are contacted by metal electrodes 9 and 10 respectively via windows in the insulating layer structure 3, 4, 5. However the source and drain may consist of metal electrodes 9 and 10 which form a rectifying Schottky contact with the n-type substrate 1 at the windows in the insulating structure 3, 4 and 5. The electrodes 9 and 10 extend away over the insulating layer portion 3.

By pulsing the junction between the substrate 1 and drain 8, 10 into avalanche breakdown, hot electrons can be injected into the insulator 4 to write a negative charge and potential on the gate electrode 6. This negative charge changes the surface potential of the semiconductor substrate 1 under the electrode 6 and increases the conductivity of the p-type channel 11 between the source 7, 9 and drain 8, 10. The channel 11 permits a hole current to flow between source and drain electrodes 9 and 10. The magnitude of the negative charge on the gate electrode 6 controls the conductance of the channel 11. Furthermore, the gate electrode 6 surrounded by the insulating layer portions 4 and 5 can be made so that this negative charge can be retained on the gate electrode 6 for more than ten years at 125° C., only insignificant leakage occurring through the insulator 4 and 5.

An IGFET structure similar in several respects to that described so far with reference to FIG. 1 is known for a binary-logic Read-only memory application, see for example, "Electronics", May 10, 1971, pages 91 to 95.

However, in accordance with the present invention, radioactive material 12 is also present in the device of FIG. 1, in the vicinity of the gate electrode 6. The material 12 is indicated by criss-cross hatching in FIG. 1.

In this example, the radioactive material 12 may be an isotope which emits low energy $\beta$ particles, for example $^{32}_{14}$Si at an energy of approximately 90 KeV, or $^{63}_{28}$Ni at an energy of approximately 65 KeV, or $^{3}_{1}$H (tritium) at an energy of approximately 12 KeV.

Each $\beta$ particle escaping from the top surface of the transistor device will in principle reduce the negative charge on the gate 6 by one unit. However, it will be appreciated that while the $\beta$ particle passes through the insulator 5 ionization occurs, and the gate electrode 6 may be discharged by an amount dependent on the life of charge carriers in the insulator 5 and the energy dissipated by the escaping $\beta$ particle. If the carrier mobility in the channel 11 is constant with temperature and gate voltage, then, this unit charge reduction of the gate electrode 6 will reduce the conductance of the channel 11 by one unit. Therefore, at any time after the IGFET has been set by the avalanche operation, the channel conductance should be directly proportional to the current which would flow through the channel 11 if a specific potential difference were applied between the source and drain electrodes 9 and 10. Therefore a measure of the channel current variation is a measure of the time interval during which that variation was produced by the radioactive decay.

The radioactive material 12 is preferably selected to have a long half-life compared with the device life, so that the rate of decay remains substantially constant over the device life. Under these circumstances, the same variation in gate-potential and channel-current will correspond to a substantially identical time interval from setting the device, at any stage during the life of the device. $^{32}_{14}$Si has a half-life of approximately $10^3$ years, and $^{63}_{28}$Ni has a half-life of approximately 125 years. Either of these is therefore suitable for use in a device having a life of 10 years or less.

The radioactive material 12 may be deposited on or with the gate electrode 6. However, very precise control of small quantities and their location can be achieved by ion implanting the radioactive isotope. This radioactive ion implantation may be effected after providing the insulating layer part 5, by forming an implanted buried layer 12.

By implanting a dose of $10^{16}$ $^{32}_{14}$Si atoms/cm.$^2$ into the vicinity of the gate electrode 6, the change of charge on the gate electrode 6 would be of the order of $6 \times 10^{11}$ electron charges/cm$^2$/month; in a structure such as that shown in FIG. 1 and having typical IGFET dimensions, this charge variation would correspond to a potential variation in the gate electrode of approximately 3 volts/month. This value is expected to vary less than 1% over 10 years. However, for a similar implantation dose of $^{63}_{28}$Ni, the gate voltage would change by approximately 1 volt/day. Thus it will be apparent that by varying the half-life and dose, the characteristics can be altered to give an IGFET timer the sensitivity and consistency required for a given application.

Preferably, a thin metal layer 13 is present on the insulating layer part 5 over the gate electrode 6 and radioactive material 12. When the material 12 is provided by ion implantation, layer 13 may be provided before or after the implantation. The layer 13 can serve to maintain the whole of the top surface of the insulating layer part 5 at the same potential, during the radioactive decay. It can also be provided with a supply conductor connection, and during avalanching of the drain junction the layer 13 may be held at a more positive potential to assist in injecting hot electrons from the avalanche into the gate electrode 6.

Preferably, measures are taken to inhibit absorption of radiated $\beta$-particles in the semiconductor substrate 1 where they might cause undesirable radiation damage of the semiconductor crystal lattice. Thus, the radioactive material 12 may be provided near only the top surface of the gate electrode 6, and the gate electrode 6 can be chosen to have a thickness sufficiently large to absorb most of the $\beta$-particles radiating towards the semiconductor substrate 1. When radioactive ion implantation is employed, the energy of the bombarding ions and hence their range relative to the thickness of layer 5 (and layer 13 if present) can be chosen so that the ions are implanted in a distribution having a peak concentration at the interface between the gate electrode 6 and the overlying insulating layer part 5.

The device of FIG. 1 may be manufactured using conventional techniques, for example thermal oxidation, photolighographic masking and etching techniques, layer deposition, thermal diffusion of impurity and ion implantation. Thus, for example the substrate 1 may be of silicon and the insulating layer 3 of thermally grown silica. The insulating layer parts 4 and 5 may be of deposited silica. The gate electrode 6 may be of high conductivity polycrystalline silicon deposited on the layer part 4 and doped, for example by diffusion, at the same time as source and drain regions 7 and 8. However the gate electrode 6 may be a metal, for example molybdenum. The layers 13, 9 and 10 may be of aluminium.

Figure 2:
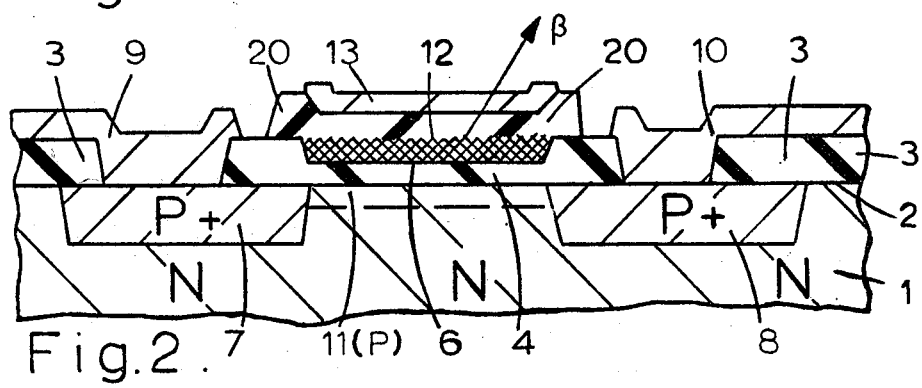

It will be evident that radioactive decay may be employed in other forms of IGFET structure to form a timing device. Thus, the IGFET shown in FIG. 2 is a p-channel enhancement mode device having a gate region 6 formed by trapping centres at an interface between a silica layer 4 and a silicone nitride 20 layer. Parts of the device of FIG. 2 corresponding to parts of the device of FIG. 1 are denoted by the same references in FIG. 2 as in FIG. 1.

It is known that charge can be stored for long periods of time at trapping centres formed at a silica/silicon-nitride interface, see for example "Electronics", July 5, 1971, pages 53 to 56. The device of FIG. 2 employs such a charge storage area to replace the buried gate electrode 6 of the device of FIG. 1. Apart from this modification, the transistor of FIG. 2 is similar in structure and operation to that of FIG. 1. A thin silica layer 4 is present on the substrate surface 2 over the region of the channel 11. The silicon nitride layer 20 is deposited on this silica layer 4, to form the charge storage area 6 at the interface. The radioactive material which is a low energy beta ($\beta$) emitter is ion implanted either through the layer 20 or before formation of the nitride layer 20. The energy of the bombarding radioactive ions is chosen so that the implantation peak occurs at the interface between the layers 20 and 4.

The device of FIG. 2 can be set by avalanching the source or drain junctions to inject hot electrons into the silica layer 4; these electrons are then trapped at the silica/silicon-nitride interface as a negative charge state. This negative charge state induces the p-type inversion channel 11. In another form, however the silica layer 4 may be thin enough to permit electron tunnelling therethrough from the n-type substrate 1; in this case, the metal layer 13 may be provided with a supply conductor connection by which a large positive potential relative to the substrate 1 is temporarily applied to the layer 13 to aid the electron tunnelling to write the negative charge state at the interface. Rather than the metal layer 13, it is then this charge storage region 6 at the interface which acts as the gate region of the IGFET to control conduction in the channel 11. The negative charge at this storage region 6 is then reduced with time by the $\beta$-particle emitting radioactive decay. The time is measured from the value of channel current, in a manner similar to that for the IGFET device of FIG. 1.

Such IGFET timers can be used in either an analogue or a digital manner. In the analogue case, the value of the channel current can be monitored and read off on a scale or dial calibrated in units of time. In another form, however, the IGFET can be used in conjunction with circuitry which senses the fall (or rise) of the channel current to a certain level (which corresponds to a certain time interval). Such circuitry on sensing that level can switch to a different state so as to perform a desired operation on an appliance or other apparatus controlled by the timer. However, such sensing circuitry can also be employed for digital operation of the IGFET timer to reset the IGFET timer (for example by re-avalanching a drain junction) when the channel current reaches a specified level; in this latter manner, a circuit arrangement including the IGFET could form a pulse generator.

Radioactive decay may be used to vary the potential of the gate region through a threshold value, so as to turn-on the IGFET in the enhancement-mode or turn-off the IGFET in the depletion-mode. Thus, the p-channel depletion-mode and enhancement-mode devices of FIGS. 1 and 2, will be turned off when the radioactive decay of the $\beta$-emitting element has sufficiently reduced or reversed the negative charge state set in the gate region 6. The time required to do this depends on the half-life and quantity of the radioactive material 12 chosen, as described hereinbefore.

It should be noted that by choosing the radioactive material 12 to be an alpha ($\alpha$) particle emitter rather than a $\beta$-emitter, a modified charge release can be obtained from the gate region 6 in either the device of FIG. 1 or the device of FIG. 2.

Figure 3:
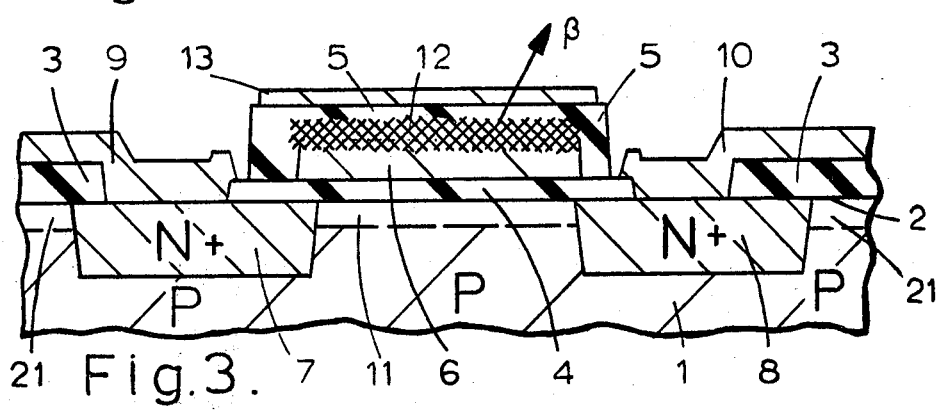

The IGFET shown in FIG. 3 is an n-channel enhancement mode device. The device structure is similar to that of FIG. 1 except that the substrate 1 is of p-type conductivity, and source and drain regions 7 and 8 are of n-type conductivity. It is known that there is a tendency for an n-type inversion skin to form on a high resistivity p-type silicon substrate below a silica layer. The presence of such an n-type inversion skin would provide a current carrying channel between the n-type source and drain regions 7 and 8 so that the device would be a depletion mode rather than enhancement mode device. The n-type inversion skin around the IGFET area would also connect the n-type source and drain regions 7 and 8 of the IGFET with neighbouring n-type regions of any adjacent circuit elements provided in the p-type substrate 1. However, in accordance with the invention described and claimed in our British Pat. No. 1,261,723 (PHB 31848), an acceptor impurity (for example boron) is implanted in the substrate 1 adjacent the surface 2. The acceptor ion dose is chosen to counteract the formation of the natural n-type inversion skin both in the channel area 11 and the surface area 21 around the transistor and to determine a precise threshold voltage for the n-channel enhancement IGFET. As explained in the said British Patent this threshold voltage can be precisely controlled by appropriately choosing the acceptor ion dose implanted in the channel area 11.

The radioactive material 12 is a low energy $\beta$-emitter implanted at the top surface of the buried gate electrode 6. As this material 12 decays, a positive charge state (and potential) is built up on the buried gate electrode 6. When this gate potential reaches the threshold voltage of the device which was determined by the acceptor ion implant in channel area 11, an n-type inversion channel forms in the area 11. An elecron current can then flow from the source (7, 9) to the drain (8, 10) when a potential difference is applied between the source and drain electrodes 9 and 10. Thus there is provided an IGFET timing device which will only switch on after a certain time has elapsed from setting. This time is determined by the threshold voltage chosen for the device, and the quantity and half-life of the radioactive material 12. Such a device could be employed in conjunction with a lock on a vault or chamber, to prevent the vault or chamber being opened before a certain time. The IGFET device of FIG. 3 can be reset by avalanching the drain or source junction to inject hot electrons into the insulator 4.

Figure 4:
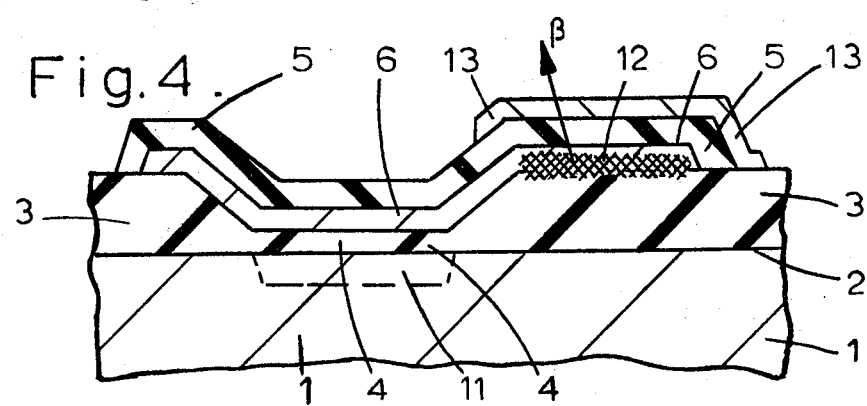

FIG. 4 shows a modified form of the IGFET of FIGS. 1 and 3 in a cross-sectional view transverse to that of FIGS. 1 and 3. The gate electrode 6 on a thin insulating layer portion 4 extends laterally outward over part of the thicker surrounding insulating layer 3. The channel 11 is present under the portion of the gate electrode 6 on the thinner layer portion 4. The charge state and potential of the gate electrode 6 influences principally and significantly the semiconductor surface potential under this electrode portion on the layer 4, and thus influences the conductance of the channel 11 as described previously with reference to FIGS. 1 and 3. However, in this modified form, the radioactive material 12 is provided in the vicinity of only that portion of the gate electrode 6 on the thicker layer 3, and the layer 3 is sufficiently thick to inhibit absorption of $\beta$-particles radiated towards the semiconductor substrate 1. Because of its good conductance, the charge state and potential of the whole gate electrode 6 is changed by the radioactive decay. In this modified form, the gate electrode 6 need not be thick, and the radioactive material need not be provided only near the top of the electrode 6 to inhibit this absorption.

Thus, the accompanying drawings show an insulated-gate field-effect device in which a radioactive element 12 is present in the vicinity of a gate region 6, and the radioactive decay changes the charge state and potential of the gate region 6 to control with time the conductance of a current channel 11 under the gate region 6. Such a gate region 6 is a charge storage-region which influences the underlying semiconductor body surface potential. An important advantage of such a device is that since the radioactive material 12 decays without employing an external power source, no external power is dissipated when such a device is counting time. For solid state watch and clock applications such an advantage would be important; however, for such an application errors arising from charge drift in the insulated gate system and from temperature variations would be undesirable.

It will be evident from what is described hereinbefore that many modifications and variations are possible within the scope of the invention. Thus, for example, a timing device may be formed in which the gate or charge-storage region consists of a charge-storage area buried in a thick insulating layer and formed by radiation damage arising from the radioactive material implant; in such a case, the radioactive material may be metallic so that the buried charge-storage area formed by the radioactive implant has a metallic nature.

A radioactive timing device in accordance with the present invention may be integrated with other circuit elements in a common semiconductor substrate. It may be, for example, a stage of a so-called "charge-coupled device" (C.C.D.), "charge-transfer device", or "bucket-brigade device" in which charge is transferred between different surface locations in a semiconductor substrate by field effect action on applying various potentials to insulated gates in sequence.

What we claim is:

1. An insulated-gate field-effect device comprising a semiconductor body portion, a gate region spaced from the semiconductor body portion by insulating material so that, by field effect action across the insulating material, the charge state of the gate region influences a channel in which charge carriers can be made to flow in the semiconductor body portion under the gate region, and radioactive material which decays by emitting charged nuclear particles, the radioactive material being in the gate region so that emitted particles transport charge from the gate region to progressively change with time the charge state of the gate region and the conductance in the channel.

2. An insulated-gate field-effect device as claimed in claim 1, in which the gate region is an electrode layer sandwiched between and entirely surrounded by insulating layer portions on the semiconductor body surface.

3. An insulated-gate field-effect device as claimed in claim 2, in which the radioactive material is on the surface of the gate electrode layer remote from the semiconductor body surface, whereby the thickness of the gate electrode layer substantially prevents emitted nuclear particles from reaching the semiconductor body.

4. An insulated-gate field-effect device as claimed in claim 1, in which a metal layer is present on an insulating layer portion over the gate region to maintain the whole top surface of the insulating layer portion at the same potential.

5. An insulated-gate field-effect device as claimed in claim 1, in which the device is an enhancement-mode device, the radioactive decay serving to form or enhance the said channel.

6. An insulated-gate field-effect device as claimed in claim 1, in which the device is a depletion-mode device, the radioactive decay serving to deplete or pinch-off the said channel.

7. A device as claimed in claim 1, in which the radioactive material has a half-life or more than $10^2$ years.

8. A device as claimed in claim 1, in which the radioactive decay emits $\beta$ particles.

9. A device as claimed in claim 1, in which the radioactive element decays directly into a stable product.

10. A semiconductor device comprising a semiconductor body portion, a charge-storage region, insulating material spacing said charge-storage region from said semiconductor body portion so that by field effect action across at least a portion of said insulating material the charge state of said charge-storage region influences the surface potential of said semiconductor body portion under at least a portion of said charge-storage region, and radioactive material which decays by emitting charged nuclear particles, said radioactive material being in said charge-storage region so that emitted particles transport charge from said charge-storage region thereby progressively changing with time the charge state of said charge-storage region and said surface potential.

11. An insulated-gate field effect device comprising:
a semiconductor body portion;
a gate region spaced from the semiconductor body portion by insulating material so that by field effect action across the insulating material the charge state of the gate region influences a channel in which charge carriers can be made to flow in the semiconductor body portion under the gate region; and
radioactive material which decays by emitting charged nuclear particles, the radioactive material being in the gate region so that emitted particles transport charge from the gate region and progressively change with time the charge state of the gate region and the conductance in the channel;
the gate region being an electrode layer sandwiched between and entirely surrounded by insulating layer portions, the radioactive material being confined to the vicinity of a surface of the gate electrode layer remote from the semiconductor body surface, the thickness of the gate electrode being sufficiently large to absorb most of the emitted nuclear particles radiating towards the semiconductor substrate;
the insulating layer portion overlying said electrode layer being a deposited layer through which said radioactive material is implanted.

* * * * *